US011768221B2

(12) United States Patent
Visconti et al.

(10) Patent No.: US 11,768,221 B2
(45) Date of Patent: Sep. 26, 2023

(54) MICROMECHANICAL SENSOR (71) Applicant: Robert Bosch GmbH, Stuttgart (DE)

(72) Inventors: Andrea Visconti, Munich (DE); Artjom Kosov, Munich (DE); Jochen Hahn, Nufringen (DE); Johannes Classen, Reutlingen (DE); Timo Giesselmann, Stuttgart (DE)

(73) Assignee: ROBERT BOSCH GMBH, Stuttgart (DE)

( * ) Notice: Subject to any disclaimer, the term of this patent is extended or adjusted under 35 U.S.C. 154(b) by 107 days.

(21) Appl. No.: 17/447,764

(22) Filed: Sep. 15, 2021

(65) Prior Publication Data
US 2022/0091157 A1 Mar. 24, 2022

(30) Foreign Application Priority Data

Sep. 21, 2020 (DE) .......................... 102020211741.1

(51) Int. Cl.
*B81B 7/02* (2006.01)
*G01P 15/18* (2013.01)

(52) U.S. Cl.
CPC ................ *G01P 15/18* (2013.01); *B81B 7/02* (2013.01); *B81B 2201/0235* (2013.01); *B81B 2207/03* (2013.01)

(58) Field of Classification Search
CPC ... G01P 15/18; G01P 3/00; B81B 7/02; B81B 2201/0235; B81B 2207/03;
(Continued)

(56) References Cited

U.S. PATENT DOCUMENTS 5,831,162 A * 11/1998 Sparks ................ G01P 15/0802
73/504.12
6,140,144 A * 10/2000 Najafi ................. B81C 1/00269
438/54
(Continued)

FOREIGN PATENT DOCUMENTS

DE 102015216471 A1 3/2017
EP 2616387 B1 5/2018
EP 2965094 B1 2/2019

OTHER PUBLICATIONS

Qi et al., "A two-Asic Front-End for MEMS Accelerometers," IEEE 15th International Conference on Solid-State & Integrated Circuit Technology (ICSICT), 2020, pp. 1-4.

*Primary Examiner* — David J Bolduc
(74) *Attorney, Agent, or Firm* — NORTON ROSE FULBRIGHT US LLP; Gerard Messina (57) ABSTRACT

A micromechanical sensor, including a micromechanical chip having a first micromechanical structure, a first evaluation chip, having a first application-specific integrated circuit, and a second evaluation chip having a second application-specific integrated circuit. The first evaluation chip and the micromechanical chip are situated in a stacked manner, the micromechanical chip being directly electrically conductively connected with the first evaluation chip and the first evaluation chip being directly electrically conductively connected with the second evaluation chip. The first application-specific integrated circuit primarily includes analog circuit elements and the second application-specific circuit primarily includes digital circuit elements.

8 Claims, 5 Drawing Sheets

(58) Field of Classification Search
CPC ...... B81B 2201/0242; B81B 2207/012; B81B 7/0032; B81B 7/007; B81B 2201/02; B81C 1/0023; B81C 2203/0154; B81C 2203/0792; G01C 19/00
See application file for complete search history.

(56) References Cited

U.S. PATENT DOCUMENTS

| | | | | |
|---|---|---|---|---|
| 6,391,673 | B1* | 5/2002 | Ha | G01C 19/5769 438/51 |
| 6,753,205 | B2* | 6/2004 | Halahan | H01L 25/0657 438/455 |
| 6,979,873 | B2* | 12/2005 | Fujii | G01P 15/0802 73/493 |
| 9,726,689 | B1* | 8/2017 | Desai | G01P 1/023 |
| 2002/0090749 | A1* | 7/2002 | Simmons | B81B 7/007 257/254 |
| 2004/0007750 | A1* | 1/2004 | Anderson | B81B 7/007 257/414 |
| 2005/0199971 | A1* | 9/2005 | Anderson | B81B 7/007 257/414 |
| 2005/0262941 | A1* | 12/2005 | Park | B81C 1/0023 73/504.02 |
| 2011/0227173 | A1* | 9/2011 | Seppala | B81C 1/0023 257/E29.324 |
| 2012/0253738 | A1* | 10/2012 | Nasiri | G01P 1/023 702/141 |
| 2012/0306038 | A1* | 12/2012 | Chow | H01L 25/167 257/434 |
| 2013/0169383 | A1* | 7/2013 | Adkisson | H03H 9/1092 333/186 |
| 2014/0062619 | A1* | 3/2014 | Montanya Silvestre | H01P 1/2002 333/186 |
| 2014/0150553 | A1* | 6/2014 | Feyh | G01P 15/18 73/514.31 |
| 2014/0231935 | A1* | 8/2014 | Wang | G01P 15/18 438/51 |
| 2015/0192416 | A1* | 7/2015 | Nasiri | G01P 15/0802 702/141 |
| 2016/0320426 | A1* | 11/2016 | Boysel | G01P 15/0802 |
| 2016/0362293 | A1 | 12/2016 | Smeys et al. | |
| 2017/0010301 | A1* | 1/2017 | Bieselt | H01L 21/02104 |
| 2017/0190572 | A1* | 7/2017 | Pan | H01L 23/3121 |
| 2018/0141803 | A1* | 5/2018 | Schelling | B81B 7/0006 |
| 2019/0330053 | A1* | 10/2019 | Tseng | B81B 7/0077 |
| 2020/0304920 | A1* | 9/2020 | Achehboune | B81C 1/00253 |
| 2020/0329299 | A1* | 10/2020 | Miller | H04R 1/222 |

* cited by examiner

MICROMECHANICAL SENSOR

CROSS REFERENCE

The present application claims the benefit under 35 U.S.C. § 119 of German Patent Application No. DE 102020211741.1 filed on Sep. 21, 2020, which is expressly incorporated herein by reference in its entirety.

FIELD

The present invention relates to a micromechanical sensor.

BACKGROUND INFORMATION

Micromechanical sensors for measuring the acceleration, rotation rate, pressure and other physical variables, for example, are manufactured in large-scale production for different applications, for example in the automotive and consumer-related areas. An increasingly important role is attributed to combined rotation rate and acceleration sensors that are installed in a shared housing. Combinations of tri-axial rotation rate sensors with tri-axial acceleration sensors are also referred to as an IMU (inertial measurement unit).

In these sensors, a micromechanical chip, also referred to as a MEMS chip, may be used. The micromechanical chip may include a micro-electromechanical system. Furthermore, the sensor may include one evaluation chip or several evaluation chips, which may be designed as an ASIC (application-specific integrated circuit), for example.

Multiple evaluation chips, however, result in an enlargement of a housing and thus of the sensor, which is undesirable. Enlargements of housing dimensions are not tolerable for many applications. In the area of "wearables" (for example smart watches) and "hearables" (for example bluetooth in-ear headphones), in particular, the overall size is a critical criterion for market success of a sensor.

SUMMARY

An object of the present invention is to provide a micromechanical sensor having an efficient space utilization, in which the housing dimensions may be kept as small as possible.

This object may be achieved with the aid of the micromechanical sensor of example embodiments of the present invention. Advantageous embodiments of the present invention are disclosed herein.

In accordance with an example embodiment of the present invention, a micromechanical sensor includes a micromechanical chip including a first micromechanical structure, a first evaluation chip including a first application-specific integrated circuit, and a second evaluation chip including a second application-specific integrated circuit. The micromechanical structure may include a micro-electromechanical system. The first evaluation chip and the micromechanical chip are situated in a stacked manner. This means that the first evaluation chip and the micromechanical chip are at least essentially situated one on top of the other. In particular, the first evaluation chip and the micromechanical chip may be situated next to one another directly adjacent, the first evaluation chip projecting above the micromechanical chip or the micromechanical chip projecting above the first evaluation chip at least partially, for example. The micromechanical chip is directly electrically conductively connected with the first evaluation chip. An electrically conductive connection between the micromechanical chip and the first evaluation chip is thus guided directly, so that the electrically conductive connection is not guided via a potentially present substrate. The first evaluation chip is directly electrically conductively connected with the second evaluation chip. An electrically conductive connection between the first evaluation chip and the second evaluation chip is thus also guided directly, i.e., not via a potentially present substrate. The first application-specific integrated circuit primarily includes analog circuit elements. The second application-specific circuit primarily includes digital circuit elements.

As a result of this design, a micromechanical sensor may be implemented with an efficient space utilization.

In one specific embodiment of the sensor in accordance with the present invention, a first technology node of the first evaluation chip is greater than a second technology node of the second evaluation chip. In this way, the space utilization may be further improved. For the analog circuit elements, in particular, larger technology nodes are necessary, as compared to the digital circuit elements, to enable particularly good signal-to-noise ratios and/or particularly low power consumption, while having comparably low manufacturing costs at the same time. The term "technology node" identifies in this case, as is common in the semiconductor technology, a milestone for the definition of a manufacturing process generation and essentially refers to the smallest photolithographically manufacturable structure size.

In one specific embodiment of the sensor in accordance with the present invention, the first technology node is in the range of 80 nanometers to 180 nanometers and/or the second technology node is smaller than 70 nanometers. This enables the space utilization to be further improved.

In one specific embodiment of the sensor in accordance with the present invention, this furthermore includes a further micromechanical chip having a second micromechanical structure. The second evaluation chip and the further micromechanical chip are situated in a stacked manner, the further micromechanical chip being directly electrically conductively connected with the first evaluation chip. An electrically conductive connection between the further micromechanical chip and the first evaluation chip is thus guided directly, so that the electrically conductive connection is not guided via a potentially present substrate.

In one specific embodiment of the sensor in accordance with the present invention, a first bond pad series of the micromechanical chip is connected with the first evaluation chip with the aid of bond wires. A second bond pad series of the further micromechanical chip is connected with the first evaluation chip with the aid of bond wires. The first bond pad series and the second bond pad series are situated perpendicularly to one another. This enables the space utilization to be further improved.

In one specific embodiment of the sensor in accordance with the present invention, the micromechanical chip has a second micromechanical structure. The second evaluation chip and the micromechanical chip are situated in a stacked manner. The first evaluation chip and the second evaluation chip are situated either both on top of or both underneath the micromechanical chip. This enables the space utilization to be further improved.

In one specific embodiment of the sensor in accordance with the present invention, the first micromechanical structure is configured for measuring a three-dimensional rotation rate and the second micromechanical structure is configured for measuring a three-dimensional acceleration.

In one specific embodiment of the sensor in accordance with the present invention, this furthermore includes a substrate. Communication pads are situated at the substrate, the first evaluation chip and/or the second evaluation chip being electrically conductively connected with the communication pads. It may in particular be provided that the first evaluation chip is electrically conductively connected with the communication pads and the second evaluation chip is connected only with the first evaluation chip. In this case, the second evaluation chip may be switched off, for example, if it is not needed at this time. This may take place through a logic that is present on the first evaluation chip, energy thus possibly being saved during the operation of the micromechanical sensor. The second evaluation chip may, however, also be electrically conductively connected with the communication pads and the first evaluation chip may only be connected with the second evaluation chip. This enables an easier communication and the saving of electrical connections.

In one specific embodiment of the sensor in accordance with the present invention, this furthermore includes a housing. The housing is a mold housing. The substrate is an integrated circuit board substrate. This enables the sensor to be cost-effectively manufactured.

In one specific embodiment of the sensor in accordance with the present invention, the first evaluation chip and the second evaluation chip are connected with one another with the aid of bond wires. This enables an efficient electrical connection between the first evaluation chip and the second evaluation chip.

Exemplary embodiments of the present invention are elucidated based on the figures.

DETAILED DESCRIPTION OF EXAMPLE EMBODIMENTS

Figure 1:
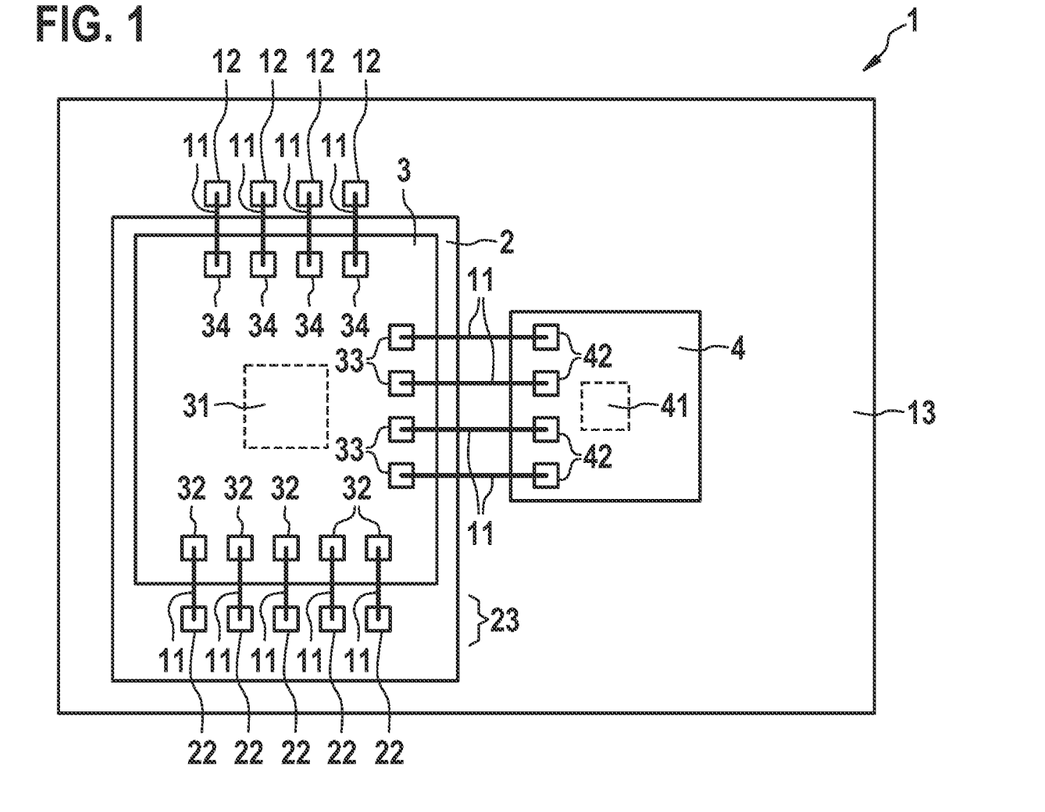
FIG. 1 schematically shows a micromechanical sensor, in accordance with an example embodiment of the present invention.

FIG. 1 shows a micromechanical sensor 1, including a micromechanical chip 2 having a first micromechanical structure, furthermore including a first evaluation chip 3, having a first application-specific integrated circuit 31, and a second evaluation chip 4 having a second application-specific integrated circuit 41. Micromechanical chip 2 is situated on an optional substrate 13. First evaluation chip 3 and micromechanical chip 2 are situated on top of one another, i.e., in a stacked manner. Micromechanical chip 2 is electrically conductively connected with first evaluation chip 3. This connection is implemented in FIG. 1 with the aid of bond wires 11 that are guided from chip pads 22 of micromechanical chip 2 to chip connection pads 32 of first evaluation chip 3. Other electrically conductive connections, for example with the aid of vias or direct bond pad connections, may also be provided, but they are not illustrated in FIG. 1. First evaluation chip 3 is electrically conductively connected with second evaluation chip 4. This connection is implemented with the aid of bond wires 11 that are guided from first data exchange pads 33 of first evaluation chip 3 to second data exchange pads 42 of second evaluation chip 4, but it may also have a design that is different from that of FIG. 1. First application-specific integrated circuit 31 primarily includes analog circuit elements and second application-specific circuit 41 primarily includes digital circuit elements.

At substrate 13, communication pads 12 are situated that are connected with evaluation communication pads 34 of first evaluation chip 3 with the aid of bond wires 11. Data may be provided from first evaluation chip 3 outside of micromechanical sensor 1 with the aid of communication pads 13. Chip pads 22 are situated in a first bond pad series 23. The number of the connections established with the aid of bond wires 11 may deviate from the number shown in FIG. 1 and is selected by those skilled in the art according to the preconditions required for chips 2, 3, 4.

Figure 2:
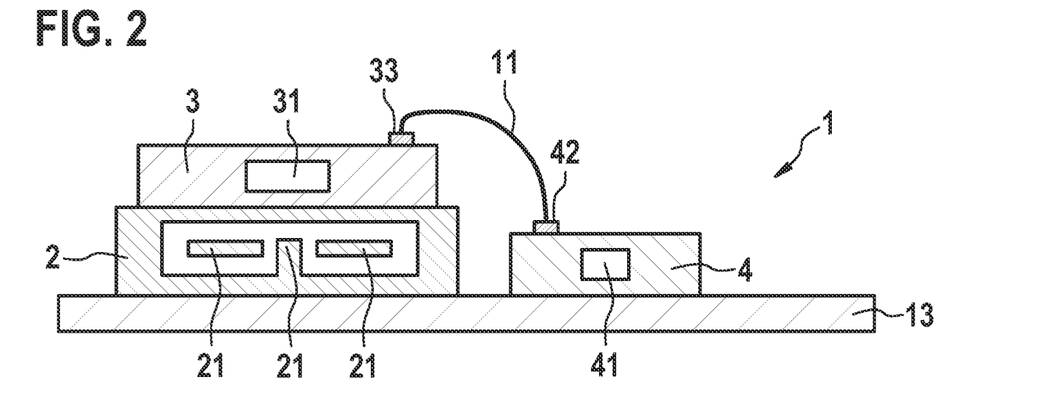
FIG. 2 schematically shows a cross section through the micromechanical sensor of FIG. 1.

FIG. 2 shows a cross section through micromechanical sensor 1 of FIG. 1 in the area of one of bond wires 11 that are guided from first data exchange pads 33 to second data exchange pads 42. Micromechanical chip 2 includes a first micromechanical structure 21 that may be designed as a pressure sensor, acceleration sensor or rotation rate sensor, for example.

In one exemplary embodiment of the sensor, a first technology node of first evaluation chip 3 is greater than a second technology node of second evaluation chip 4. In one exemplary embodiment, the first technology node is in the range of 80 nanometers to 180 nanometers. In one exemplary embodiment, the second technology node is smaller than 70 nanometers.

Figure 3:
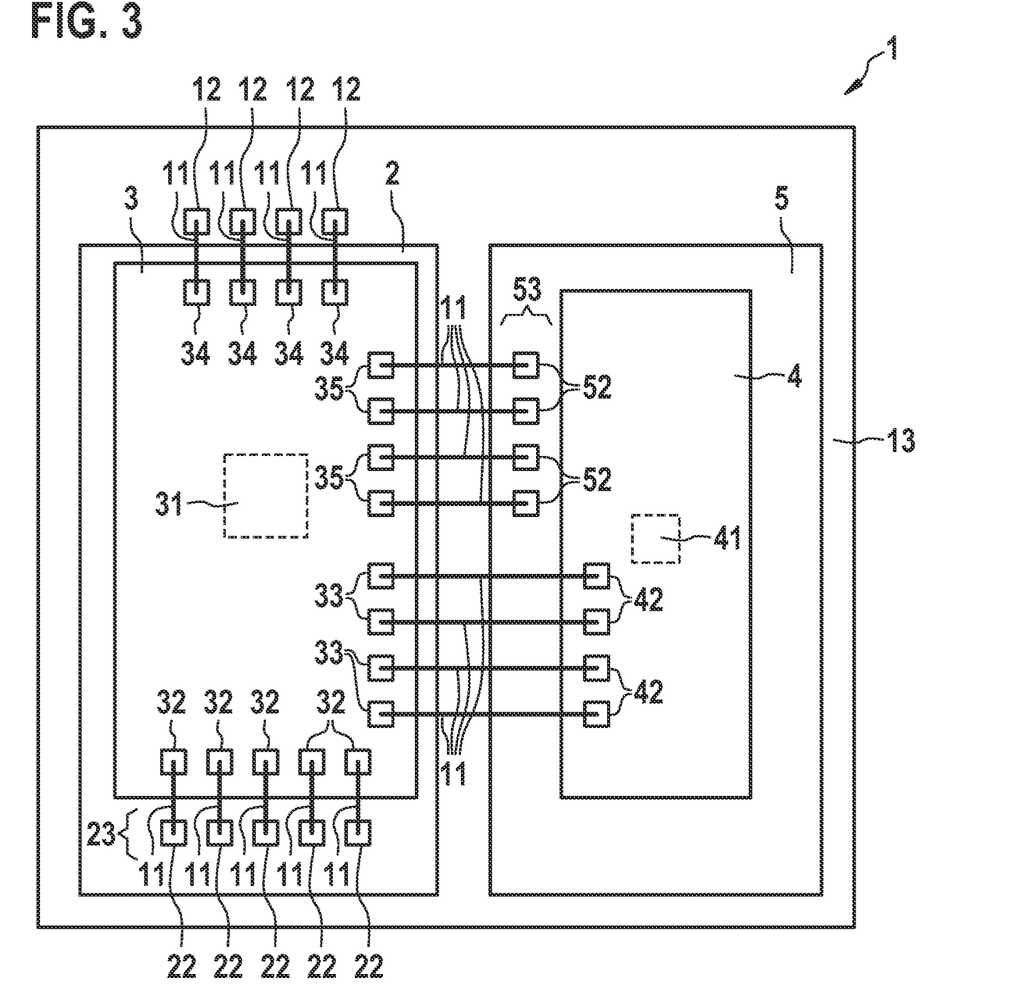
FIG. 3 schematically shows a further micromechanical sensor, in accordance with an example embodiment of the present invention.

FIG. 3 shows a micromechanical sensor 1 that corresponds to micromechanical sensor 1 of FIGS. 1 and 2, insofar as no differences are described below. Micromechanical sensor 1 furthermore includes a further micromechanical chip 5 having a second micromechanical structure. Further micromechanical chip 5 is situated on an optional substrate 13. Second evaluation chip 4 and further micromechanical chip 5 are situated on top of one another, i.e., in a stacked manner. Further micromechanical chip 5 is electrically conductively connected with first evaluation chip 3. This connection is implemented in FIG. 3 with the aid of bond wires 11 that are guided from further chip pads 52 of further micromechanical chip 5 to further chip connection pads 35 of first evaluation chip 3. Other electrically conductive connections, for example with the aid of vias or direct bond pad connections, may also be provided, but they are not illustrated in FIG. 3. Further chip pads 52 are situated in a second bond pad series 53.

First evaluation chip 3 is situated above micromechanical chip 2. Second evaluation chip 4 is situated above further micromechanical chip 5. In one alternative embodiment, first evaluation chip 3 may be situated underneath micromechanical chip 2 and/or second evaluation chip 4 may be situated underneath further micromechanical chip 5. Which of these arrangements is the most favorable depends in particular on the chip surfaces needed for the two micromechanical chips 2, 5 and the two evaluation chips 3, 4, the larger chip being typically, but not necessarily, situated underneath the smaller chip in each case.

Figure 4:
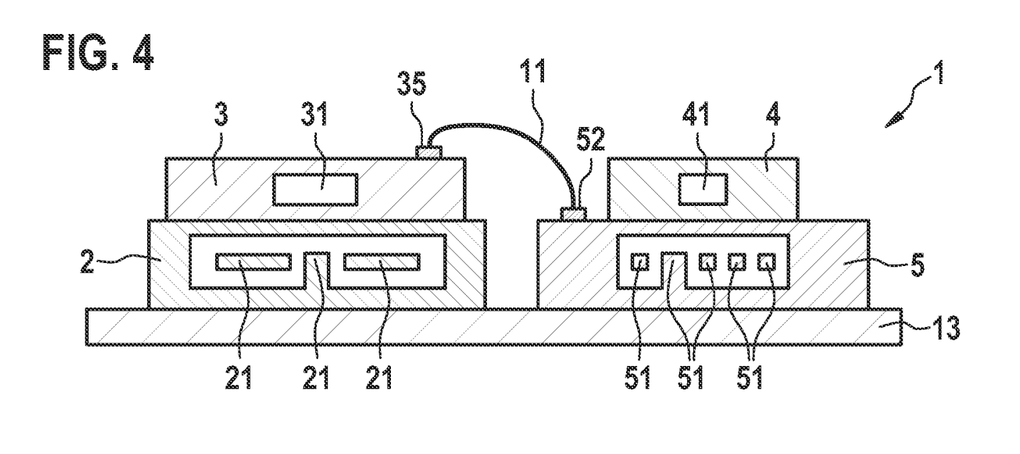
FIG. 4 schematically shows a cross section through the further micromechanical sensor of FIG. 3.

FIG. 4 shows a cross section through micromechanical sensor 1 of FIG. 3 in the area of one of bond wires 11 that are guided from further chip connection pads 35 to further chip pads 52. Further micromechanical chip 5 includes a second micromechanical structure 51 that may be designed as a pressure sensor, acceleration sensor or rotation rate sensor, for example.

Figure 5:
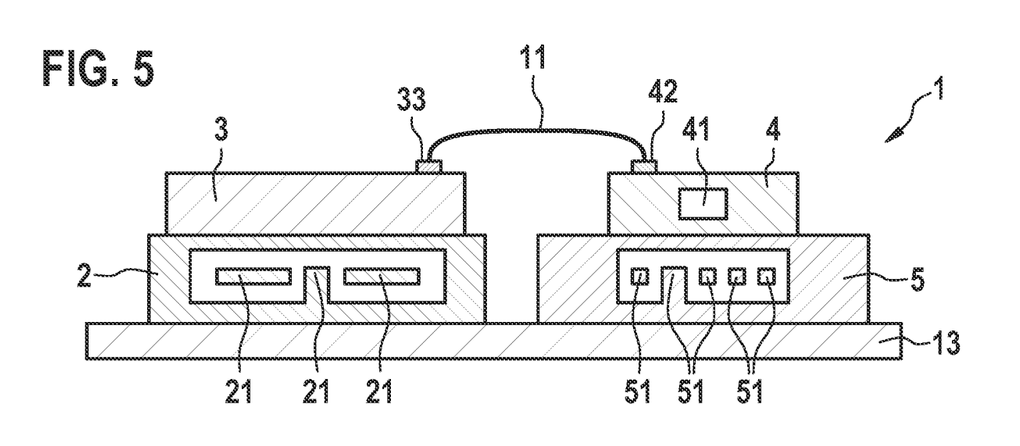
FIG. 5 schematically shows a further cross section through the further micromechanical sensor of FIG. 3.

FIG. 5 shows a cross section through micromechanical sensor 1 of FIG. 3 in the area of one of bond wires 11 that are guided from first data exchange pad 33 to second data exchange pad 42.

In one exemplary embodiment, first bond pad series 23 of micromechanical chip 2 is connected with first evaluation chip 3 with the aid of bond wires 11. Furthermore, second bond pad series 53 of further micromechanical chip 5 is connected with first evaluation chip 3 with the aid of bond wires 11. First bond pad series 23 and second bond pad series 53 are situated perpendicularly to one another, as illustrated in FIG. 3.

Figure 6:
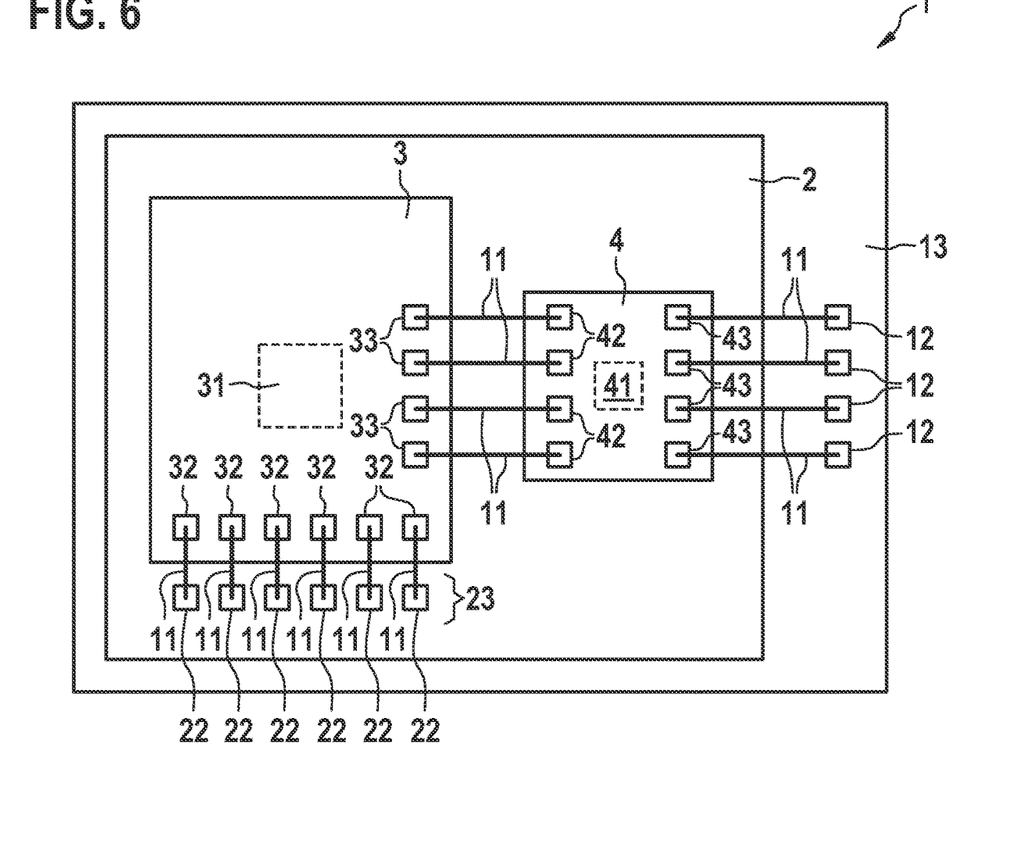
FIG. 6 schematically shows a further micromechanical sensor, in accordance with an example embodiment of the present invention.

FIG. 6 shows a micromechanical sensor 1 that corresponds to micromechanical sensor 1 of FIGS. 1 and 2, provided that no differences are described below. Micromechanical chip 2 includes a second micromechanical structure, second evaluation chip 4 and micromechanical chip 2 being situated in a stacked manner. First evaluation chip 3 and second evaluation chip 4 are both situated above micromechanical chip 2.

Furthermore, it is illustrated in FIG. 6 that communication pads 12 of substrate 13 are connected with further evaluation communication pads 43 of second evaluation chip 4. However, evaluation communication pads 34 of first evaluation chip 3 are not present in this case. This embodiment of FIG. 6 may also be provided in the exemplary embodiments of FIGS. 1 through 5. Alternatively, the exemplary embodiment of FIG. 6 may also include evaluation communication pads 34 of first evaluation chip 3, as illustrated in FIG. 1, instead of further evaluation communication pads 43 of second evaluation chip 4.

If first evaluation chip 3 is electrically conductively connected with communication pads 12 and second evaluation chip 4 is only connected with first evaluation chip 3, as illustrated in FIGS. 1 and 3, second evaluation chip 4 may be switched off, for example, if it is not needed at this time. This may take place through a logic that is present on first evaluation chip 3, energy thus possibly being saved during the operation of micromechanical sensor 1. If second evaluation chip 4 is electrically conductively connected with communication pads 12 and first evaluation chip 3 is only connected with second evaluation chip 4, as illustrated in FIG. 6, a simpler communication and the saving of electrical connections are possible.

Figure 7:
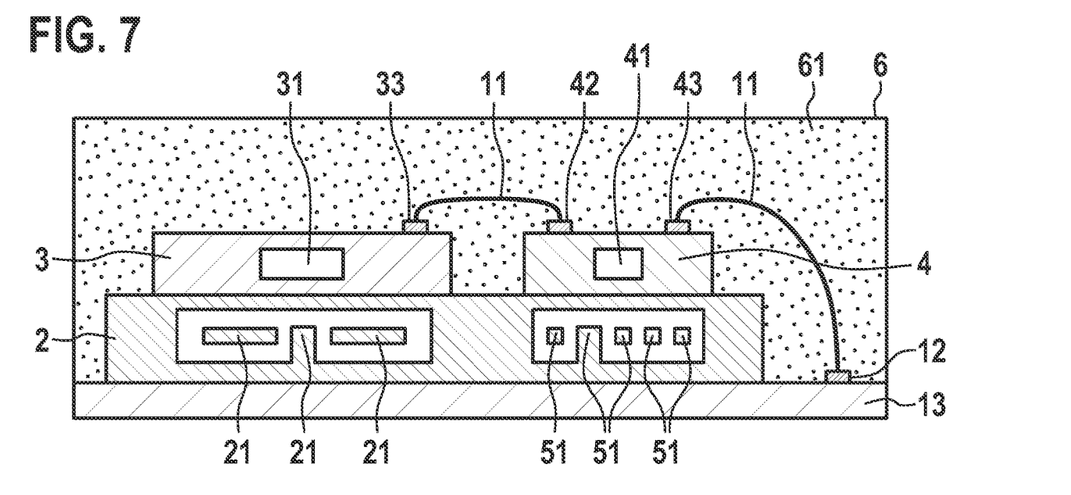
FIG. 7 schematically shows a cross section through the further micromechanical sensor of FIG. 6.

FIG. 7 shows a cross section through micromechanical sensor 1 of FIG. 6 in the area of one of bond wires 11 that are guided from first data exchange pad 33 to second data exchange pad 42. Micromechanical chip 2 includes first micromechanical structure 21 and second micromechanical structure 51.

A cross section of housing 6, housing 6 being a mold housing, is also illustrated in FIG. 7. Substrate 13 may be an integrated circuit board substrate in this case. Within housing 6, a mold material 61 may be situated, micromechanical chip 2, evaluation chips 3, 4, and bond wires being embedded into mold material 61 in particular and thus a mechanical protection of these elements being provided. The housing of FIG. 7 may also be provided in the exemplary embodiments of FIGS. 1 through 5.

In the exemplary embodiment of FIGS. 3 and 4, but also in the exemplary embodiment of FIGS. 5 and 6, it may be provided that first micromechanical structure 21 is configured for measuring a three-dimensional rotation rate and second micromechanical structure 51 being configured for measuring a three-dimensional acceleration.

In all exemplary embodiments, first evaluation chip 3 may in particular include analog front-end circuits for activating and evaluating the signals of micromechanical chip 2 or of micromechanical chips 2, 5, while second evaluation chip 4 may in particular include a microprocessor and/or a digital signal processor and/or memory cells. On the microprocessor and/or digital signal processor, more complex computations may be carried out and larger data quantities may be stored to implement additional functions, such as data fusion, self-calibration, and specific filtering.

Figure 8:
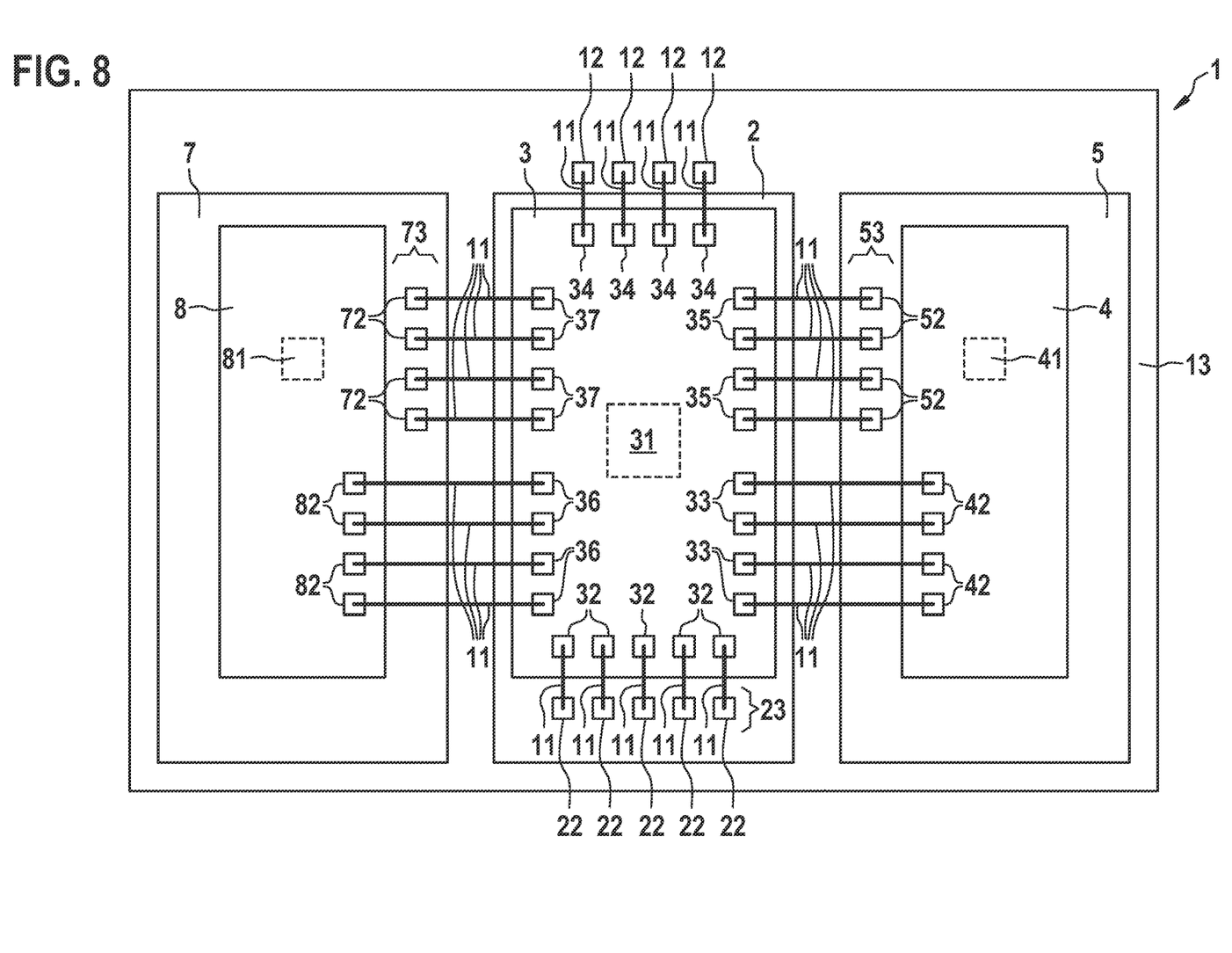
FIG. 8 schematically shows a further micromechanical sensor, in accordance with an example embodiment of the present invention.

FIG. 8 shows a micromechanical sensor 1 that corresponds to micromechanical sensor 1 of FIGS. 3 through 5, provided that no differences are described below. Micromechanical sensor 1 furthermore includes a further micromechanical chip 7 having a third micromechanical structure, the third micromechanical structure being constructed analogously to first micromechanical structure 21 or to second micromechanical structure 51. Further micromechanical chip 7 is situated on an optional substrate 13. A third evaluation chip 8 having a third application-specific circuit 81 is situated above further micromechanical chip 7. Third evaluation chip 8 and further micromechanical chip 7 are situated on top of one another, i.e., in a stacked manner. Further micromechanical chip 7 is electrically conductively connected with first evaluation chip 3. This connection is implemented in FIG. 8 with the aid of bond wires 11 that are guided from further chip pads 72 of further micromechanical chip 7 to further chip connection pads 37 of first evaluation chip 3. Other electrically conductive connections, for example with the aid of vias or direct bond pad connections, may also be provided, but they are not illustrated in FIG. 8. Further chip pads 72 are situated in a third bond pad series 73. First evaluation chip 3 is electrically conductively connected with third evaluation chip 8. This connection is implemented with the aid of bond wires 11 that are guided from further first data exchange pads 36 of first evaluation chip 3 to third data exchange pads 82 of third evaluation chip 8, but it may also have a design that is different from that of FIG. 8. Third application-specific circuit 81 primarily includes digital circuit elements, analogously to second application-specific circuit 41. Third bond pad series 73 is perpendicular to first bond pad series 23 and parallel to second bond pad series 53.

It is, in deviation from the illustration of FIG. 8, also possible to implement micromechanical sensor 1 without further micromechanical chip 7 or without third evaluation chip 8.

Although the present invention has been elucidated in greater detail using the preferred exemplary embodiments, the present invention is not limited to the provided examples and other variants may be deduced therefrom by those skilled in the art without departing from the protective scope of the present invention.

What is claimed is:

1. A micromechanical sensor, comprising:
   a micromechanical chip having a first micromechanical structure;

a first evaluation chip having a first application-specific integrated circuit;

a second evaluation chip having a second application-specific integrated circuit, the first evaluation chip and the micromechanical chip being situated in a stacked manner, the micromechanical chip being directly electrically conductively connected with the first evaluation chip, the first evaluation chip being directly electrically conductively connected with the second evaluation chip, the first application-specific integrated circuit primarily including analog circuit elements, and the second application-specific circuit primarily including digital circuit elements, a further micromechanical chip having a second micromechanical structure;

wherein the second evaluation chip and the further micromechanical chip are situated in a stacked manner, the further micromechanical chip being directly electrically conductively connected with the first evaluation chip;

wherein a first bond pad series of the micromechanical chip is connected with the first evaluation chip using bond wires, a second bond pad series of the further micromechanical chip is connected with the first evaluation chip using bond wires, the first bond pad series and the second bond pad series being situated perpendicularly with regard to one another.

2. The micromechanical sensor as recited in claim 1, wherein a first technology node of the first evaluation chip is greater than a second technology node of second evaluation chip.

3. The micromechanical sensor as recited in claim 2, wherein the first technology node is in a range of 80 nanometers to 180 nanometers and/or the second technology node is smaller than 70 nanometers.

4. The micromechanical sensor as recited in claim 1, wherein the micromechanical chip includes a second micromechanical structure, the second evaluation chip and the micromechanical chip being situated in a stacked manner, the first evaluation chip and the second evaluation chip being situated both above or both underneath the micromechanical chip.

5. The micromechanical sensor as recited in claim 1, wherein the first micromechanical structure is configured to measure a three-dimensional rotation rate and the second micromechanical structure is configured to measure a three-dimensional acceleration.

6. The micromechanical sensor as recited in claim 1, further comprising:
   a substrate, wherein communication pads are situated at the substrate, the first evaluation chip and/or the second evaluation chip being electrically conductively connected with the communication pads.

7. The micromechanical sensor as recited in claim 6, further comprising:
   a housing, wherein the housing is a mold housing and the substrate is an integrated circuit board substrate.

8. The micromechanical sensor as recited in claim 1, wherein the first evaluation chip and the second evaluation chip are connected with one another using bond wires.

* * * * *